United States Patent [19] [11] 3,911,560
Amelio et al. [45] Oct. 14, 1975

[54] METHOD FOR MANUFACTURING A SEMICONDUCTOR DEVICE HAVING SELF-ALIGNED IMPLANTED BARRIERS WITH NARROW GAPS BETWEEN ELECTRODES

[75] Inventors: Gilbert F. Amelio, Saratoga; Harold H. Hosack, Cupertino, both of Calif.

[73] Assignee: Fairchild Camera and Instrument Corporation, Mountain View, Calif.

[22] Filed: Feb. 25, 1974

[21] Appl. No.: 445,361

[52] U.S. Cl. ........................ 29/578; 29/580; 357/24
[51] Int. Cl.$^{2}$ ........................ B01J 17/00
[58] Field of Search .......... 29/571, 576, 578, 576 B, 29/580; 357/24

[56] References Cited

UNITED STATES PATENTS

| | | | |
|---|---|---|---|
| 3,755,793 | 8/1973 | Ho | 357/24 |
| 3,770,988 | 11/1973 | Engeles | 357/24 |
| 3,796,928 | 3/1974 | Doo | 357/24 |
| 3,810,795 | 5/1974 | Troutman | 357/24 |
| 3,852,799 | 12/1974 | Walden | 357/24 |

*Primary Examiner*—W. Tupman
*Attorney, Agent, or Firm*—Alan H. MacPherson; Norman E. Reitz

[57] ABSTRACT

An improved method for manufacturing a semiconductor device is disclosed, wherein self-alignment is achieved between implanted barrier regions in the semiconductor substrate and gate portions of the device. The method includes the step of forming an oxide insulating layer over a polycrystalline silicon layer followed by the step of forming a nitride layer over the oxide layer. In this process the gate electrodes that are formed in the device are separated by very narrow gaps.

11 Claims, 9 Drawing Figures

METHOD FOR MANUFACTURING A SEMICONDUCTOR DEVICE HAVING SELF-ALIGNED IMPLANTED BARRIERS WITH NARROW GAPS BETWEEN ELECTRODES

BACKGROUND OF THE INVENTION

1. Field of the Invention

This invention relates to a method for manufacturing a semiconductor device; and, more particularly, to an improved method for manufacturing a charge coupled device having self-aligned implanted barriers.

2. Description of Prior Art

W. S. Boyle and G. E. Smith describe the basic concept of charge coupled semiconductor devices in an article published in the Apr. 19, 1970 *Bell System Technical Journal*, page 587, entitled "Charge Coupled Semiconductor Devices." As described by Boyle and Smith, a charge coupled device consists of a metal-insulation-semiconductor (MIS) structure in which minority carriers are stored in a "spatially defined depletion region," also called a "potential well" at the surface of the semiconductor material. The charge is moved along the surface by moving the potential minimum. A paper on page 593 of the same volume of the *Bell System Technical Journal* by Amelio et al. entitled "Experimental Verification of the Charge Coupled Device Concept" described experiments carried out to demonstrate feasibility of the charge coupled device concept.

As discussed by Boyle and Smith, charge coupled devices are potentially useful as shift registers, delay lines, and in two dimensions, as imaging devices or display devices.

In patent application Ser. No. 429,329, filed 28 Dec. 1973 by M. P. Anthony, et al., entitled "Self Aligned CCD Element Including Fabrication Method Therefor", and assigned to the same assignee as the present application, a charge coupled semiconductor device (hereinafter referred to as "CCD") having self-aligned implanted barriers and the process for making such a device is described. Although this process was known when the subject invention was made, the process of this invention produces effectively the same structure through novel steps not obvious to one skilled in this art.

As pointed out by Anthony, et al., in the above-cited copending patent application, efficient CCD operation is unsatisfactory as long as there is a gap between adjacent electrodes. This gap is useless in the sense that it does not store charge and can be considered wasteful since it occupies area on the silicon chip, thus consuming material which could be more efficiently used. Accordingly, the Anthony et al. invention provides a structure and a process for fabricating charge coupled devices in which the barrier regions are aligned with corresponding phase electrodes and in which the gaps must be very narrow.

The importance of extremely accurate processing to yield charge coupled devices with predictable and reproducible characteristics for use in two-phase operation was pointed out in one of the first papers on the subject by Krambeck, Walden, and Pickar entitled "Implanted Barrier Two-Phase Charge-Coupled Device" published in *Applied Physics Letters*, Vol. 19, No. 12, pp. 520–522, 1971.

BRIEF DESCRIPTION OF THE INVENTION

This invention provides an improved method of manufacturing a semiconductor device having self-aligned barriers with very narrow gaps between electrodes. The improved method comprises the steps of forming a first insulating layer and an electrically conducting layer on one surface of a semiconductor substrate, forming a layer of an oxide over the electrically conducting layer, forming a layer of a nitride over the oxide layer such that the combined oxide and nitride layers form a second insulating layer over the electrically conducting layer, forming barrier regions in the surface portion of the semiconductor substrate, defining portions of the second insulating layer located over the barrier regions which demarcate the underlying distance from the left-end portion of alternate barrier regions to the left-end portion of the next adjacent barrier regions, removing the defined portions of the second insulating layer and the electrically conducting layer to form a first plurality of gate electrodes over alternate barrier and storage regions, and forming a second plurality of gate electrodes over the remaining alternate barrier and storage regions. The oxide layer protects the remaining portions of the electrically conducting region during the step of removing defined portions of the electrically conducting layer.

Briefly, the process of this invention includes forming over a semiconductor substrate, successively, layers of a first oxide, a first nitride, a first conducting material, a second oxide, a second nitride, a deposited oxide material, and a photoresist masking pattern; removing selected portions of the deposited oxide layer; implanting barrier regions in the substrate by irradiating ions through the first conducting, nitride, and oxide layers; removing the photoresist mask; removing selected portions of the second nitride and the second oxide layers with the deposited oxide and nitride as successive masks; removing the deposited oxide layer; thermally growing oxide islands in the exposed portions of the first conducting layer; forming a second photoresist mask over alternate ones of said oxide islands; removing the exposed oxide islands; removing the second nitride layer; removing the unprotected portions of the first conducting layer; appropriately masking the remaining oxide islands and portions of the first conducting layer; removing the oxide on the unprotected portions of the first conducting layer with the photoresist as a mask, and then removing the exposed portions of the first conducting layer; removing the photoresist mask; forming an oxide layer over the exposed portions of the first conducting layer, and forming a second conducting layer between the remaining portions of the insulated first conducting layer. The remaining portions of the first conducting layer form electrodes of a first phase, and the second conducting layer forms second phase electrodes, thereby providing alternating electrodes that are aligned with the barrier regions in the semiconductor material.

IN THE DRAWINGS

Figure 6:
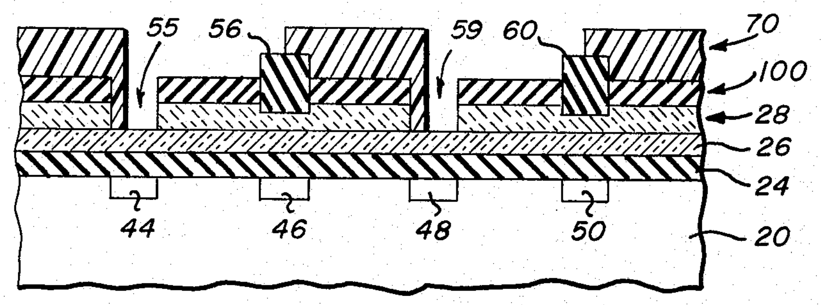

FIG. 6 is an elevational cross-sectional view of the device of the invention after further processing, having the uncovered silicon dioxide islands removed, the second photoresist pattern removed, the second nitride layer removed, the polycrystalline silicon has been etched with the second oxide and second nitride layers as successive masks, and a third photoresist pattern formed over the remaining structure from a central portion of the remaining unremoved silicon dioxide island to a central portion of adjacent openings formed by the removed silicon dioxide islands.

Figure 7:
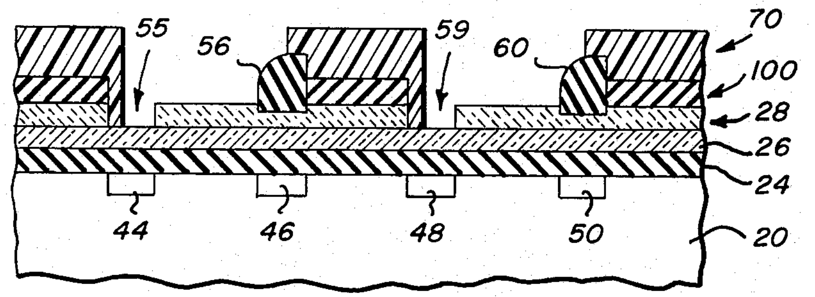

FIG. 7 is an elevational cross-sectional view of the device of the invention after further processing, having the exposed portion of the second oxide layer and portions of the remaining silicon dioxide islands etched away.

Figure 8:
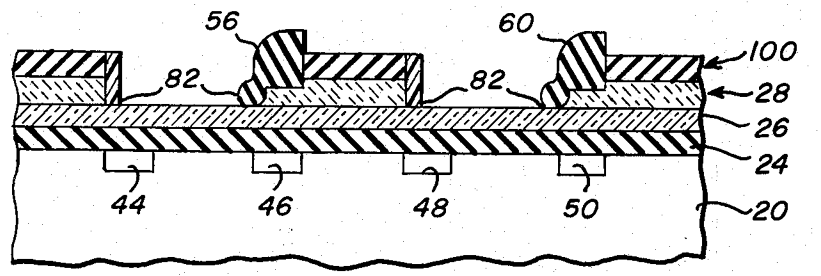

FIG. 8 is an elevational cross-sectional view of the device of the invention after the exposed portions of the polycrystalline silicon layer have been etched away using the overlying third photoresist pattern and remaining portions of the second oxide layer as a mask, the third photoresist layer has been removed, and exposed portions of the remaining parts of the polycrystalline silicon layer have been oxidized.

Figure 9:
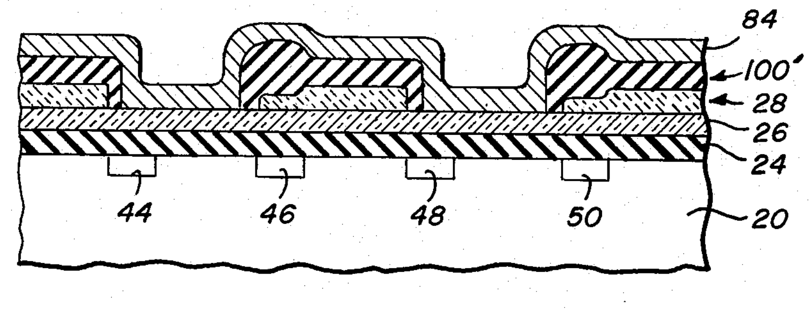

FIG. 9 is a cross-sectional view of the final structure of the invention after the formation of the electrically conducting layer on the top surface of the structure.

DETAILED DESCRIPTION

Figure 1:
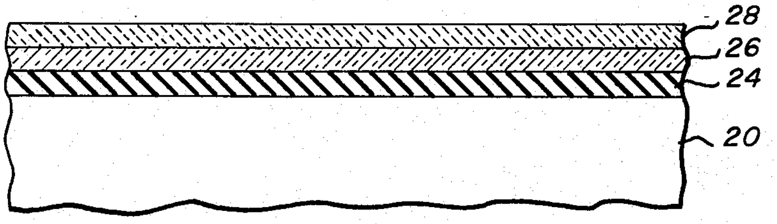
FIG. 1 is an elevational cross-sectional view of a semiconductor substrate after the first steps of the invention, having a first oxide layer formed on one surface of the substrate, a second nitride layer formed over the first oxide layer, and a polycrystalline silicon layer formed over the second nitride layer.

Referring to FIG. 1, a semiconductor substrate or wafer 20 is used as the starting material for the fabrication of the final CCD structure. The substrate 20 may comprise a slice of p-type conductivity silicon including, for example, doped silicon. Although the described embodiment uses a silicon semiconductor boron doped it is evident to those skilled in the art that other semiconductor materials may be used. Furthermore, the conductivity type regions described in the embodiment shown in the drawings can be of opposite type conductivity, if desired, in order to provide a CCD structure using charge packets with the opposite type of minority carriers.

An insulating layer 24, which for example may comprise silicon dioxide, is formed on the substrate surface by well-known thermal oxidation techniques. In one example, the thermally grown layer 24 has a thickness of about 1200 Angstrom units. A second insulating layer 26 is deposited or formed over the first insulating layer 24. The second insulating layer 26, which for example may comprise silicon nitride, is deposited by well-known techniques used by those skilled in the art of depositing or forming layers of silicon nitride. In the example where the first insulating layer 24 was 1200 Angstrom units thick, the silicon nitride layer 26 was 400 Angstrom units thick. Silicon nitride is preferred as the second insulating layer 26 because thermally grown oxides will not form on silicon nitrides. However, silicon nitride can be formed over silicon dioxide. The silicon nitride is very useful in protecting the underlying layer 24 from becoming significantly thicker which would normally occur during the subsequent heat treatment steps in the process of this invention. Additionally, the silicon nitride layer 26 functions as a further protective layer against pinholes in the underlying layer 24. Other materials having similar characteristics may be employed for layer 26.

Thereafter, a polycrystalline silicon layer 28 is deposited on top of the second insulating layer 24. The polycrystalline silicon layer is a doped layer containing impurities (typically phosphorous when layer 28 is doped with an n-type impurity) of a sufficient quantity to permit the doped polycrystalline silicon layer 28 to function as an electrical conductor or gate electrode. In one example, layer 28 has a thickness of about 3,000 to about 4,000 Angstrom units.

Figure 2:
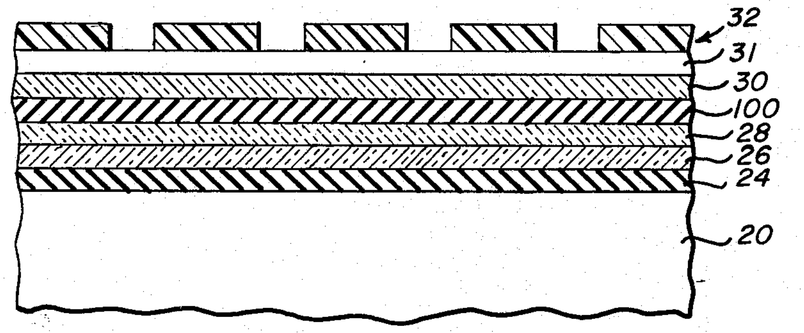
FIG. 2 is an elevational cross-sectional view of the device of the invention after further processing, having a second oxide layer formed in accordance with this invention over the polycrystalline silicon layer, a second nitride layer formed over the second oxide layer, and a layer of deposited oxide and a first photoresist pattern formed over the second nitride layer.

Referring now to FIG. 2, in accordance with this invention a third insulating layer 100 is formed or deposited on top of the doped polycrystalline silicon layer 28. The third insulating layer 100 typically may comprise silicon dioxide. A fourth insulating layer 30 is formed or deposited on top of the silicon dioxide layer 100. The fourth insulating layer typically may comprise silicon nitride. Since oxides do not thermally grow to any appreciable amount on nitride, this layer functions to selectively control the formation of oxides during the subsequent process steps. A deposited oxide layer 31 is formed over the fourth insulating layer 30, and a first photoresist pattern 32 is formed over the deposited oxide layer 31. Since nitride cannot satisfactorily be etched with a photoresist mask, the deposited oxide layer 31 is employed as an intermediate mask, and the photoresist pattern 32 is employed for masking the deposited oxide layer 31.

Figure 3:
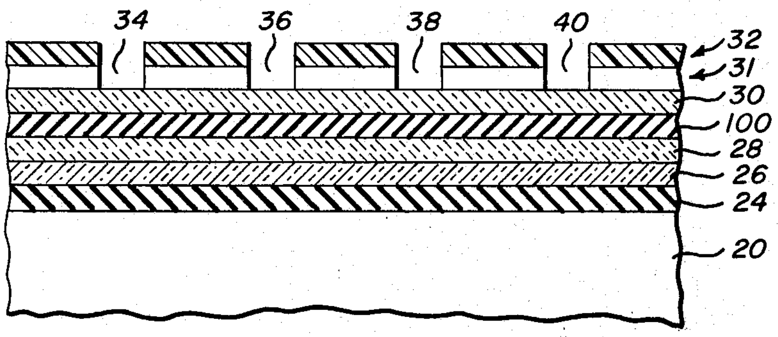
FIG. 3 is an elevational cross-sectional view of the device of the invention after further processing, having the deposited oxide layer etched away in areas defined by the first photoresist masking pattern.

Referring to FIG. 3, the deposited layer 31 is etched using conventional etchants, and using the photoresist pattern 32 as a mask. A plasma etchant may also be used for this etching process step, and for the subsequent etching process steps discussed hereinafter. A plasma etchant provides straight vertical edges on the material remaining after the etch operation. Following this etching process step, openings 34, 36, 38, 40 . . . are formed in the silicon nitride layer 31. For example, these openings have a diameter of about 0.1 to about 0.15 mils and are used subsequently to define the size of ion-implanted barrier regions that are to be formed in the silicon substrate 20.

Figure 4:
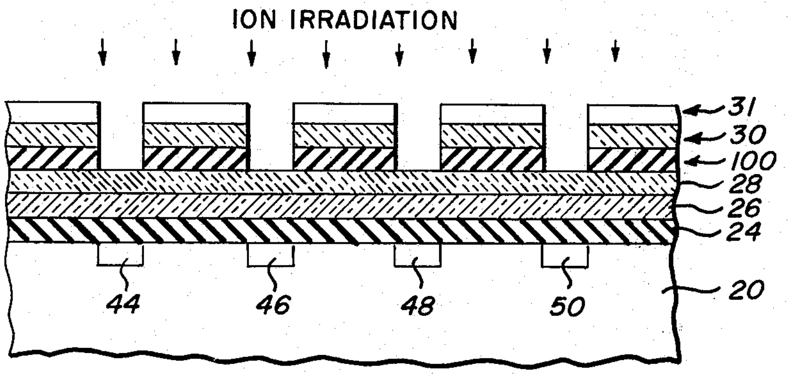
FIG. 4 is an elevational cross-sectional view of the device of the invention after ions have been irradiated over the structure so as to implant barrier regions in the semiconductor substrate, after the first photoresist pattern has been removed, and after portions of the second nitride and the second oxide insulating layers have been etched away beneath the openings in the deposited oxide layer.

Referring to FIG. 4, an ion-implantation operation is shown which serves to implant desired impurity ions in the silicon substrate 20 through the openings 34, 36, 38, 40 . . . . If substrate 20 comprises a p-type material, boron ions are implanted so as to form ion-implanted barriers 44, 46, 48, 50 . . . in the substrate beneath corresponding openings 34, 36, 38, 40 . . . . The barriers are implanted at the desired depth, within the structure by adjusting the ion implant energy. In one example, the implant energy was set within the range of 100KV to 200KV. Although boron is the p-type ion used in the disclosed embodiment, other p-type ions may be used to form the desired type of implanted barrier regions.

The next step in the process of forming the structure of FIG. 4 is the etching of the nitride layer 30 and the oxide layer 100 with the deposited oxide layer 31 and nitride layer 30 as successive masks.

The order of the process steps described hereinabove can be modified. For example, the nitride layer 30 and the oxide layer 100 can be etched prior to the ion-irradiation process step. Also, the deposited oxide layer 31 can be removed prior to the ion-irradiation step. If the deposited oxide layer 31 is removed prior to the ion irradiation process step, a small but negligible amount of ions will implant within the oxide layer 100 and the polycrystalline silicon layer 28. A lower ion implant energy is required if layers 30 and 100 have been etched prior to the ion-irradiation process step.

Figure 5:
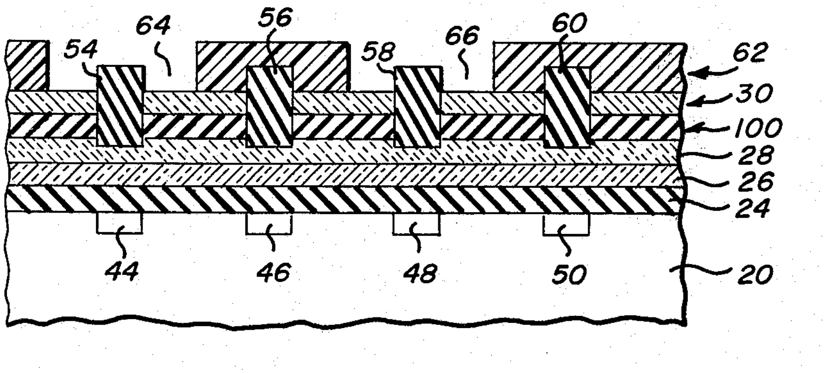
FIG. 5 is an elevational cross-sectional view of the device of the invention after the deposited oxide layer has been removed, thermal oxidation has been carried out to form silicon dioxide islands on the exposed portions of the polycrystalline silicon layer, and a second photoresist masking pattern has been formed over alternate ones of the silicon dioxide islands.

Referring now to FIG. 5, the deposited oxide layer 31 is removed. This is done with the use of conventional removal solutions. A thermal oxidation step is performed using standard thermal oxidation techniques to form or deposit an oxide of the semiconductor material, which in this case is silicon dioxide, onto the surface of the polycrystalline silcicon layer 28 within the openings 34, 36, 38, 40 . . . . Accordingly, the oxidation grows oxide islands 54, 56, 58, 60 . . . on the polycrystalline silicon layer 28. Since oxide does not grow appreciably on a silicon nitride surface, as discussed above, the oxide islands grow only above the exposed portions of layer 28. Also, the oxide grows to some extent into the underlying polycrystalline silicon layer 28 as illustrated in FIG. 5. The islands are illustrated as being of a greater thickness than the corresponding thickness of silicon dioxide layer 100, which added thickness is useful during a subsequent etching process step.

The next process step illustrated in FIG. 5 is that of depositing another photoresist layer 62 selectively over alternate oxide islands, such as islands 56 and 60, using conventional photolithographic masking techniques.

Referring to FIG. 6 an oxide etching operation is carried out to remove the alternate oxide islands 54, 58 . . . , thereby leaving openings 55, 59 . . . , respectively. The photoresist layer 62 is removed by conventional techniques, and subsequently the nitride layer 30 is etched away. The portions of the polycrystalline silicon layer 28 exposed by openings 55, 59 . . . are etched down to the nitride layer 26 using the oxide layer 100 as a mask.

The next step in the process of forming the structure shown in FIG. 6 is selectively depositing another photoresist layer 70 over portions of oxide layer 100 and portions of oxide islands 56, 60 . . . . In particular, photoresist layer 70 is deposited to cover the area from the center of oxide islands, such as islands 56 and 60, to the center of an adjacent opening, such as openings 55 and 59, respectively.

Referring to FIG. 7, portions of oxide layer 100, which are not covered by photoresist layer 70, are etched away. Simultaneously, portions of the oxide islands, such as islands 56 and 60, are etched away. It is important that this etching operation be performed carefully so as not to over-etch the oxide islands 56, 60 . . . . Some portion of the oxide islands 56, 60 . . . are needed as an insulation between the polycrystalline silicon layer 28 and a subsequently formed overlying conductor. The added thickness of the oxide islands provides additional oxide to help prevent over-etching during this process step. An added thickness of 4000 Angstrom units was found to be satisfactory.

Referring to FIG. 8, the portions of the polycrystalline silicon layer 28 not covered by either the photoresist layer 70 or the oxide islands 56, 60 . . . are etched away. The remaining portions of layer 28, which are adjacent to the etched-out portions of layer 28, are protected on the top by the photoresist mask 70; and on the sides by the relatively thick oxide islands 56, 60 . . . . During this operation, no erosion of the surface of the nitride layer 26 under the polycrystalline silicon layer 28 occurs since layer 26 is impervious to the polycrystalline silicon etchant. This is important since this nitride layer 26 protects the barrier and storage regions in the substrate 20. It has been found that if the polycrystalline silicon layer 28 is undercut by as little as 2000 Angstroms, the advantages of self-alignment are sacrificed, and device performance may degrade. As a result of the sequence of the above-described process steps, and by the formation of the thick oxide islands 54, 56, 58, 60 . . . , undercutting of the polycrystalline silicon layer 28 is reduced. Thus, an extremely precise alignment between the left surface of the polycrystalline silicon regions under oxide islands 56, 60 . . . and the respective surfaces of ion-implanted barrier regions 46, 50 . . . is achievable. The terms "left" and "right" as used herein refer to the drawings when viewed in a conventional manner, since it is well known that the layers may be oriented in many different positions.

Oxide layers 82 are formed by thermal oxidation over the exposed surfaces of the remaining polycrystalline silicon electrodes of layer 28, which serve to electrically insulate the electrodes 28 from a subsequently formed conducting layer.

Referring to FIG. 9, a conducting layer 84 is formed over the entire top surface of the structure by vapor deposition, although other techniques can be utilized. The combination of oxide layer 100, oxide islands 56, 60 . . . , and oxide layers 82 is depicted and identified in FIG. 9 as a combined oxide layer 100'.

The conducting layer 84, as shown in FIG. 9, comprises a single conductor of finite width, wherein "width" refers to the dimension orthogonal to the drawing. A plurality of such conducting layers can be formed parallel to one another for fabricating a structure similar to that disclosed in the article, "Charge-Coupled Imaging Devices: Experimental Results", M. F. Tompsett et al., *IEEE Transactions on Electron Devices*, Vol. ED 18, No. 11, pp. 992–996, November 1971. If the structure illustrated in FIG. 9 comprises a portion of a charge coupled area array, the conductors of conductive layer 84 are formed orthogonal to the electrodes 28. However, conductive layer 84 can be formed into a plurality of conductors parallel to the polycrystalline silicon electrodes 28, if desired. In addition, conductive layer 84 can comprise one continuous sheet.

Accordingly, a two-phase, ion-implanted barrier CCD arrangement has been provided wherein self-alignment is achieved between the ion-implanted barrier regions 44, 46, 48, 50 . . . . The respective gate electrodes associated with the barrier regions electrically cooperate to permit charge packets to be transmitted in shift register fashion along the surface of the CCD structure, such as in disclosed in the above-cited patent application Ser. No. 391,119.

The process of this invention preserves the alignment between the implanted barriers and the gate electrodes with extreme accuracy because the sequence of process steps described above reduces the possibility of undercutting the polycrystalline silicon layer 28. Additionally, only very narrow gaps between electrodes are formed, wherein the gap size is defined by the thickness of the insulating layers 82 grown on the sides of the polycrystalline silicon layer 28. Since the charge transfer speed varies exponentially with the square of the distance between electrodes, these narrow gaps enhance the operating speed of the device.

To improve the performance of the device of the present invention, buried channel construction may be employed. A buried channel is obtained typically by forming a layer of appropriate impurities (n-type impurities for an n-channel device, and p-type impurities for a p-channel device) in the semiconductor substrate near the substrate-insulator interface. Typically, this layer is formed using ion implantation techniques. Such a buried channel is not illustrated in the figures; however, a buried channel, if employed, would be implanted within the substrate 20 prior to the formation of the overlying layers.

Although this invention has been described using silicon gate technology, one skilled in the art should recognize that other technologies may also be utilized by replacing the disclosed materials with materials native to that technology.

What is claimed is:

1. A method of fabricating a self-aligned semiconductor structure comprising the steps of:

a. forming a first insulating layer on a semiconductor substrate;

b. forming an electrically conducting layer on said first insulating layer;

c. forming a second insulating layer on said electrically conducting layer;

d. removing portions of said second insulating layer at regular intervals along said second insulating layer to demarcate the location of barrier regions to be formed in underlying registration in said substrate;

e. forming barrier regions in the surface portion of said substrate;

f. forming silicon dioxide islands within said removed portions;

g. removing those silicon dioxide islands and those portions of said electrically conducting layer above a first series of alternate barrier regions;

h. removing that portion of said second insulating layer and said electrically conducting layer which span the distance between the right-hand edge of each barrier region of said first series of alternate barrier regions and the left-hand edge of the adjacent barrier regions, the removal being accomplished with minimal undercutting of the left-hand edge of the portions of said electrically conducting layer which remain to thereby produce a plurality of gate electrodes in self-alignment with the underlying adjacent barrier regions;

i. forming protective insulation over said plurality of gate electrodes; and j. forming a second plurality of gate electrodes in interstitial arrangement with said plurality of gate electrodes.

2. The method as recited in claim 1 wherein said electrically conducting layer formed on said first insulating layer is doped polycrystalline silicon.

3. The method as recited in claim 2 wherein said first insulating layer comprises a first layer of silicon dioxide formed on a silicon substrate and a first layer of silicon nitride formed on said layer of silicon dioxide.

4. The method as recited in claim 3 wherein said second insulating layer further comprises a second layer of silicon nitride formed on a second layer of silicon dioxide.

5. The method as recited in claim 4 wherein said silicon dioxide islands are formed by thermal oxidation of said electrically conducting layer, said second layer of silicon nitride preventing thermal oxidation except within said cavities.

6. The method as recited in claim 4 wherein said step of forming barrier regions comprises the step of irradiating ions over the surface of said structure to thereby implant ions in said substrate.

7. The method as recited in claim 6 wherein said step of selectively forming protective insulation is accomplished by the step of thermally oxidizing the surface regions of said remaining portions of said electrically conducting layer.

8. The method as recited in claim 1 wherein said step of forming a second plurality of gate electrodes comprises the step of forming a continuous conducting layer over the top surface of said structure so that portions of said conducting layer are formed on said first insulating layer in interstitial arrangement with said plurality of gate electrodes.

9. The method as recited in claim 8 wherein said step of forming a continuous conducting layer is accomplished by chemical vapor deposition.

10. The method as recited in claim 1 further comprising the step of forming a buried channel layer in the surface of said substrate.

11. A process for fabricating a self-aligned semiconductor structure having narrow gaps between associated electrodes comprising the steps of:

a. forming a first oxide insulating layer on one surface of a semiconductor substrate;

b. forming a first nitride insulating layer on said first oxide layer;

c. forming a first conducting layer on said first nitride layer;

d. forming a second layer of oxide on the surface of said first conducting layer;

e. forming a second layer of nitride on said second oxide layer;

f. depositing a layer of oxide on said second nitride layer;

g. forming a first layer of photoresist on said deposited oxide layer, said photoresist layer having a plurality of openings therethrough;

h. removing portions of said deposited oxide layer beneath said openings in said first photoresist layer;

i. forming barrier regions in said semiconductor substrate within an area defined by said openings in said deposited oxide layer and said first photoresist layer;

j. removing said first photoresist layer;

k. removing portions of said second nitride layer beneath openings in said deposited oxide layer;

l. removing portions of said second oxide layer beneath openings in said second nitride layer;

m. removing said deposited oxide layer;

n. forming oxide islands on said first conducting layer within an area defined by openings in said second oxide layer;

o. forming a second layer of photoresist over alternate ones of said oxide islands;

p. removing said oxide islands not covered by said second photoresist layer;

q. removing said second nitride layer;

r. removing exposed portions of said first conducting layer within an area defined by openings in said second oxide layer;

s. forming a third layer of photoresist over said second oxide layer having openings from the center of openings formed by the removal of alternate oxide islands to the center of the adjacent remaining oxide islands;

t. removing portions of said second oxide layer under said openings in said third photoresist layer so as to expose the top surface of said first conducting layer;

u. removing exposed portions of said first conducting layer wherein said second oxide layer, said silicon dioxide islands, and said third photoresist layer prevent removal of portions of said first conducting layer that are not exposed, thereby providing alignment between the left surface of said implanted barrier regions and respective surfaces of the remaining portions of said first conducting layer;

v. removing said third photoresist layer;

w. selectively forming a third oxide layer on the remaining portions of said first conducting layer, so as to provide an insulating surface; and x. forming a second conducting layer over said top insulating surface, thereby to provide a structure having barriers aligned with the corresponding edges of said remaining portions of said first conducting layer.

* * * * *